United States Patent
Han et al.

(10) Patent No.: US 9,564,322 B1
(45) Date of Patent: Feb. 7, 2017

(54) METHOD OF EXCIMER LASER ANNEALING

(71) Applicant: SAMSUNG DISPLAY CO., LTD., Yongin-Si, Gyeonggi-Do (KR)

(72) Inventors: Gyoo Wan Han, Yongin-Si (KR); Vladimir Tokarev, Hwaseong-Si (KR); Je Kil Ryu, Yongin-Si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/163,346

(22) Filed: May 24, 2016

(30) Foreign Application Priority Data

Nov. 13, 2015 (KR) .......................... 10-2015-0159419

(51) Int. Cl.
*H01L 21/02* (2006.01)
(52) U.S. Cl.
CPC ... *H01L 21/02675* (2013.01); *H01L 21/02422* (2013.01); *H01L 21/02532* (2013.01); *H01L 21/02592* (2013.01)

(58) Field of Classification Search
None
See application file for complete search history.

(56) References Cited

U.S. PATENT DOCUMENTS

| | | |
|---|---|---|
| 6,169,014 B1 | 1/2001 | McCulloch |
| 6,656,270 B2 | 12/2003 | Chung |
| 8,362,391 B2 | 1/2013 | Partlo et al. |
| 8,658,939 B2 | 2/2014 | Chung |
| 2003/0201466 A1 | 10/2003 | Ogawa et al. |

(Continued)

FOREIGN PATENT DOCUMENTS

| | | |
|---|---|---|
| EP | 1687877 | 10/2008 |
| KR | 1020110054466 | 5/2011 |

(Continued)

OTHER PUBLICATIONS

Van der Wilt, P.C., "Excimer-laser annealing: microstructure evolution and a novel characterization technique". SID Symp. Digest, Invited Paper 13.1 (2014).

(Continued)

*Primary Examiner* — Asok K Sarkar
(74) *Attorney, Agent, or Firm* — F. Chau & Associates, LLC

(57) ABSTRACT

A method of excimer laser annealing includes generating a focused long line beam with a laser beam output from at least one laser source; and scanning the long line beam in a direction perpendicular to a long axis of the long line beam along a surface of an amorphous semiconductor film on a substrate. The long line beam has a normalized beam angular divergence half-width $\phi=\arctan(\tan\theta_y/\sin\theta)$ that is less than a critical value $\phi_c$, where $\theta_y$ represents a beam angular divergence half-width measured along the long axis of the long line beam on the surface of the amorphous semiconductor film, $\theta$ represents a mean incidence angle of the long line beam on the surface of the amorphous semiconductor film, and $\phi_c$ is approximately 30°.

20 Claims, 20 Drawing Sheets

(56) References Cited

U.S. PATENT DOCUMENTS

| | | | |
|---|---|---|---|
| 2005/0269300 A1 | 12/2005 | Partlo et al. | |
| 2007/0278193 A1 | 12/2007 | Hofmann | |
| 2008/0188012 A1* | 8/2008 | Yazaki | B23K 26/032 438/7 |
| 2010/0221898 A1* | 9/2010 | Nishida | B23K 26/0608 438/487 |

FOREIGN PATENT DOCUMENTS

| | | |
|---|---|---|
| KR | 1020120000166 | 1/2012 |
| KR | 1020130075720 | 7/2013 |
| WO | WO2005054949 | 6/2005 |
| WO | WO2009036716 | 3/2009 |
| WO | WO2010033194 | 3/2010 |

OTHER PUBLICATIONS

Guosheng, Z., et al., "Growth of spontaneous periodic surface structures on solids during laser illumination". Phys. Rev. B vol. 26 (10), 5366 (1982).

Sipe, J. E., et al., "Laser-induced periodic surface structure: I. Theory." Phys. Rev. B vol. 27 (2), 1141 (1983).

Young, J. F., et al., "Laser-induced periodic surface structure: II. Experiments on Ge, Si, Al, and brass". Phys. Rev. B vol. 27 (2), 1155 (1983).

Fauchet, P.M. et al., "Observations of higher-order laser-induced surface ripples on <111> Germanium". Appl. Phys. A 32, 135-140 (1983).

Akhmanov, S. A. et al., "Interaction of powerful laser radiation with the surfaces of semiconductors and metals: nonlinear optical effects and nonlinear optical diagnostics". Sov. Phys. Uspekhi 28 (12), 1084 (1985).

Siegman, A. E., "Stimulated Wood's anomalies on laser-illuminated surfaces". IEEE J. Quantum Electron. vol. QE-22, No. 8, 1384 (1986).

Stultz, T. J. et al., "The use of beam shaping to achieve large-grain cw laser-recrystallized polysilicon on amorphous substrates". Appl. Phys. Lett. 39, 498 (1981).

Horita, S., et al., "Alignment of grain boundary in a Si film crystallized by a linearly polarized laser beam on a glass substrate". Appl. Phys. Lett., 78, 2250 (2001).

Kaki, H. et al., "Periodic grain-boundary formation in a poly-Si thin film crystallized by a linearly polarized Nd:YAG pulse laser with an oblique incident angle". J. Appl. Phys. 97, 014904 (2005).

Horita, S., et al., "Surface modification of an amorphous Si thin film crystallized by a linearly polarized Nd:YAG pulse laser beam". J. Appl. Phys. 102, 013501 (2007).

Wikipedia, "Germanium". htttps://en.wikipedia.org/wiki/Germanium.

Wikipedia, "Silicon". https://en.wikipedia.org/wiki/Silicon.

\* cited by examiner

Exit window contamination

METHOD OF EXCIMER LASER ANNEALING

CROSS-REFERENCE TO RELATED APPLICATION

This application claims priority under 35 U.S.C. §119 from, and the benefit of, Korean Patent Application No. 10-2015-0159419, filed in the Korean Intellectual Property Office on Nov. 13, 2015, the contents of which are herein incorporated by reference in their entirety.

BACKGROUND (a) Technical Field

Embodiments of the present disclosure are directed to a method of excimer laser annealing.

(b) Discussion of the Related Art

Excimer laser annealing (ELA) can be used to form transistors used for switches or driving circuits of display devices, such as an organic light emitting display device and a liquid crystal display device. In an ELA method, an excimer laser beam is irradiated to an amorphous semiconductor film formed on a substrate to locally heat and melt the amorphous semiconductor film and thereafter, crystallize the corresponding amorphous semiconductor film into a polycrystalline semiconductor film while cooling the heated amorphous semiconductor film. The crystallized semiconductor film can form a high performance transistor because of increased electron mobility.

Therefore, ELA is used for modern mass production of display devices. For manufacturing uniformity of the transistors of the display devices, the polycrystalline semiconductor film formed by ELA should be uniform. To improve the uniformity and electrical characteristics of the semiconductor film, rectangular grains may be formed. ELA control factors include energy density, the number of overlapping pulses, pulse duration, an incidence angle, a substrate temperature, etc.

SUMMARY

An exemplary embodiment of the present disclosure can provide a method of excimer laser annealing which forms a polycrystalline semiconductor film with enhanced and uniform characteristics.

An exemplary embodiment of the present disclosure provides a method of excimer laser annealing, including: generating a focused long line beam with a laser beam output from at least one laser source; and scanning the long line beam in a direction perpendicular to a long axis of the long line beam along a surface of an amorphous semiconductor film on a substrate. The long line beam has a normalized beam angular divergence half-width $\phi=\arctan(\tan\theta_y/\sin\theta)$ that is less than a critical value $\phi_c$, where $\theta_y$ represents a beam angular divergence half-width measured along the long axis of the long line beam on the surface of the amorphous semiconductor film, $\theta$ represents an mean incidence angle of the long line beam on the surface of the amorphous semiconductor film, and $\phi_c$ is approximately 30°.

The long line beam may be unpolarized on the surface of the amorphous semiconductor film.

The beam angular divergence half-width may be less than a critical value $\theta_{y,c}$, where the critical value $\theta_{y,c}$ depends on the mean incidence angle $\theta$ and the critical value $\phi_c$ as expressed by $\theta_{y,c}(\theta)=\arctan[\tan\phi_c\cdot\sin\theta]$.

The long line beam may have the mean incidence angle $\theta=6°$ and the beam angular divergence half-width $\theta_y$ may be less than 60.3 mrad.

The method may further include increasing the mean incidence angle $\theta$ from a previous value $\theta_1$ to a new incidence angle $\theta_2$ at which $\theta_y<\theta_{y,c}(\theta_2)$ is satisfied, when the beam angular divergence half-width $\theta_y$ of the long line beam does not satisfy $\theta_y<\theta_{y,c}(\theta_1)$ for the previous value of the mean incidence angle $\theta=\theta_1$.

The long line beam may have the beam angular divergence half-width $\theta_y$ in the range of 62 to 90 mrad and $\theta_2>12°$.

The long line beam may have a width in the range of 10 to 500 mm and a length in the range of 200 to 2000 mm.

The normalized beam angular divergence half-width $\phi$ may be less than 5°.

The normalized beam angular divergence half-width $\phi$ may be 4.8°, the beam angular divergence half-width $\theta_y$ may be 1.24° (=21.7 mrad), and the incidence angle $\theta$ may be 15°.

The laser beam may be elliptically polarized on the surface of the amorphous semiconductor film and a direction of a dominant polarization axis follows a direction of the scanning or is perpendicular to the scanning direction.

The long line beam may be circularly polarized on the surface of the amorphous semiconductor film.

The long line beam may be plane-polarized on the surface of the amorphous semiconductor film and have both an s-component and a p-component of polarization in an excimer laser annealing set-up geometry.

The long line beam may be s-polarized on the surface of the amorphous semiconductor film.

Two perpendicular scannings of the long line beam may be performed relative to the surface of the amorphous semiconductor film to generate two perpendicular laser-induced periodic surface structures (LIPSSs).

The laser source may be a UV gas laser having a wavelength in the range of 192-352 nm.

The laser source may be a UV solid laser having a wavelength in the range of 265-356 nm.

The amorphous semiconductor film may be an amorphous silicon film.

Another exemplary embodiment of the present disclosure provides a method of excimer laser annealing that includes scanning a focused long line laser beam in a direction perpendicular to a long axis of the long line beam along the surface of an amorphous semiconductor film on a substrate. The long line beam has a normalized beam angular divergence half-width $\phi=\arctan(\tan\theta_y/\sin\theta)$ that is less than a critical value $\phi_c$, where $\theta_y$ represents a beam angular divergence half-width measured along the long axis of the long line beam on the surface of the amorphous semiconductor film, $\theta$ represents a mean incidence angle of the long line beam on the surface of the amorphous semiconductor film, and $\phi_c$ is approximately 30°. If the beam angular divergence half-width $\theta_y$ is greater than a critical value $\theta_{y,c}(\theta)=\arctan[\tan\phi_c\cdot\sin\theta]$, the method includes increasing the mean incidence angle $\theta$ to a new incidence angle $\theta_2$ wherein $\theta_y<\theta_{y,c}(\theta_2)$ is satisfied.

The long line beam may have the mean incidence angle $\theta=6°$ and the beam angular divergence half-width $\theta_y$ is less than 60.3 mrad.

The long line beam may have the beam angular divergence half-width $\theta_y$ in the range of 62 to 90 mrad and $\theta_2>12°$.

According to an exemplary embodiment of the present disclosure, since a polycrystalline semiconductor film having substantially rectangular grains can be formed by excimer laser annealing, electron mobility and uniformity of the polycrystalline semiconductor film can be improved. As a result, in a display device adopting the polycrystalline semiconductor film, electrical characteristics and uniformity of all transistors can be improved.

DETAILED DESCRIPTION OF EXEMPLARY EMBODIMENTS

Figure 1:
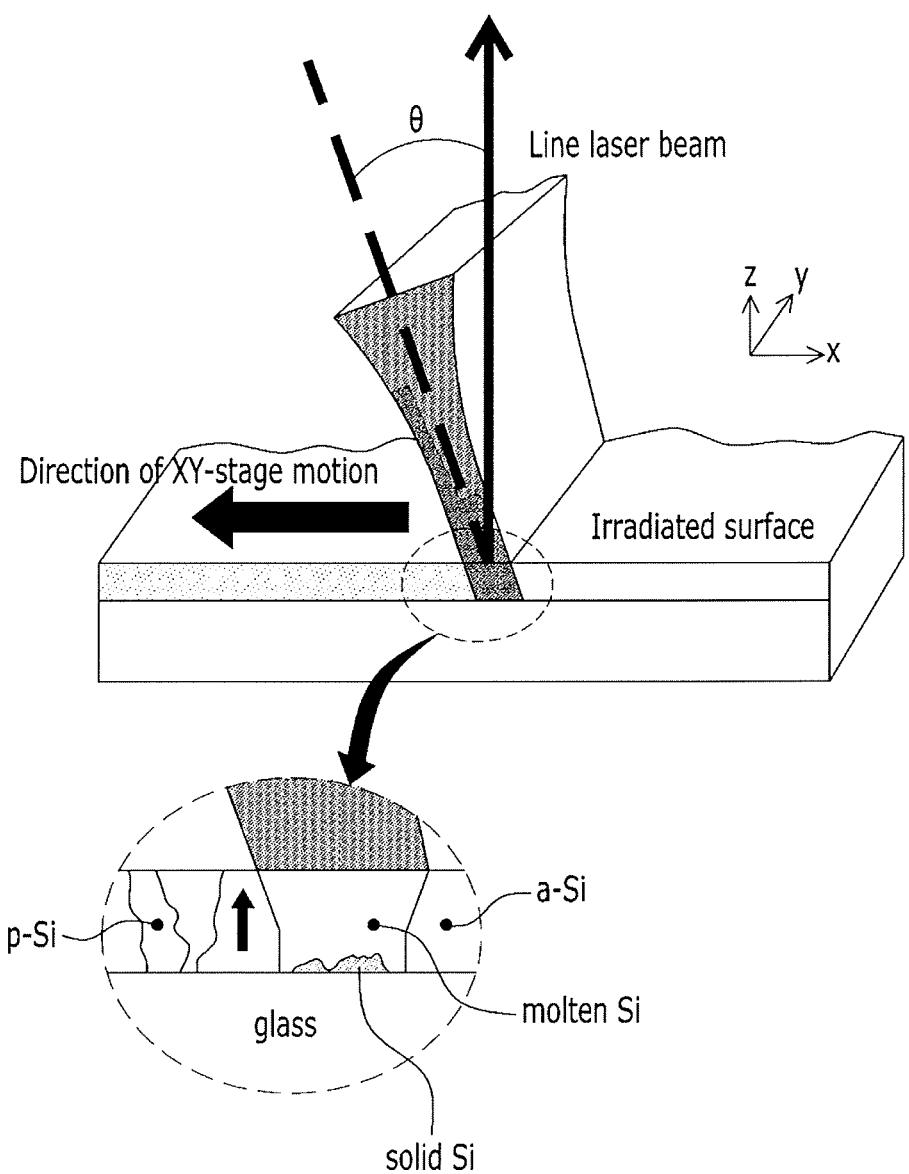
FIG. 1 schematically illustrates the annealing of an amorphous silicon film by scanning an excimer laser beam according to an exemplary embodiment of the present disclosure.

Embodiments of the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Throughout the specification, like reference numerals may refer to like elements. In drawings, thicknesses and sizes of multiple layers and areas may be enlarged or reduced to clearly express layouts and relative positions thereof.

It will be understood that when an element such as a layer, film, region, or substrate is described as being "on" another element, it can be directly on the other element or intervening elements may also be present. Herein, when two or more elements are described as being approximately the same as each other, it is to be understood that the elements are identical to each other, indistinguishable from each other, or distinguishable from each other but functionally the same as each other as would be understood by a person having ordinary skill in the art.

Excimer laser annealing according to an exemplary embodiment of the present disclosure will be described in detail with reference to the drawings.

FIG. 1 schematically illustrates the annealing of an amorphous silicon film by scanning an excimer laser beam, according to an exemplary embodiment of the present disclosure. A linear beam along a y axis scans the surface of an amorphous silicon film along an x axis.

In an existing excimer laser annealing (ELA) design, for example, a rectangular 308 nm XeCl excimer laser beam, hereinafter referred to as a long line beam or a linear beam, is homogenized into, for example, an elongated narrow spot having a width of approximately 0.4 mm and a length of approximately 1300 mm, hereinafter referred to as a "design 1 ELA", or a width of approximately 0.4 mm and a length of approximately 1500 mm, hereinafter referred to as a "design 2 ELA", using cylindrical optics. In FIG. 1, a coordinate system xyz is shown with respect to a process system, in which x corresponds to a direction of an XY-stage motion, y is a direction of a spot long axis, and z is a direction vertical to an irradiated surface parallel to the xy plane. An incidence angle θ is formed between the normal (z direction) of the irradiated surface and a direction of the elongated narrow spot.

A processed material may be, for example, an amorphous silicon (a-Si) film having a thickness of approximately 50 nm on an $SiO_2$ substrate. When a material surface is scanned on an XY-stage along a short axis of the beam, the beam is irradiated at each laser spot position about 20 to 33 times with the same fluence. As a result, the film melts and re-solidifies into polycrystalline silicon (p-Si) grains having a size of, for example, about 0.3 μm×0.3 μm and an electron mobility that is two orders magnitude greater than that of initial a-Si. A scanning speed and a pulse repetition frequency can be selected to be within a range of, for example, 6 to 40 times, to obtain an annealing result in which laser spots overlap at respective points on the surface to which the beam is irradiated.

By the scanning of pulse-periodic irradiation, ELA induces the spontaneous formation of ripples, known as "laser-induced periodic surface structures (LIPSS)".

Figure 2A:
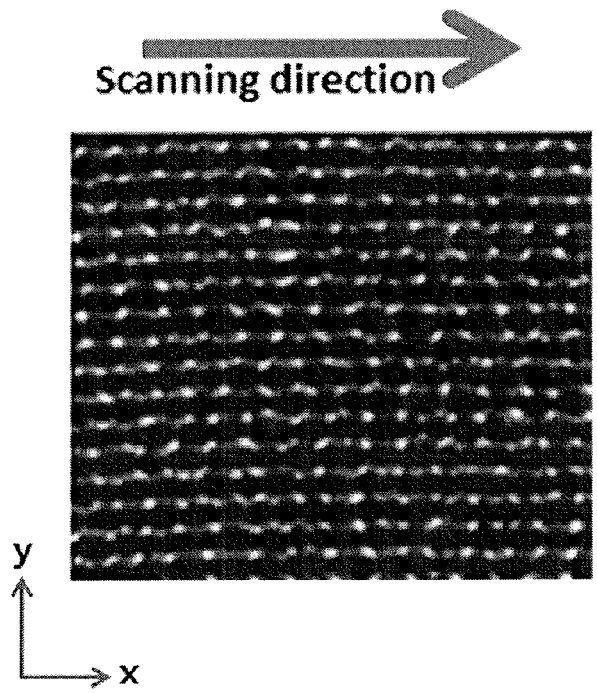
FIGS. 2A to 2D illustrate experimental results for surface roughness in a real space and an arrangement of reflexes in a Fourier space for a scanning direction, according to an exemplary embodiment of the present disclosure.
Figure 2B:
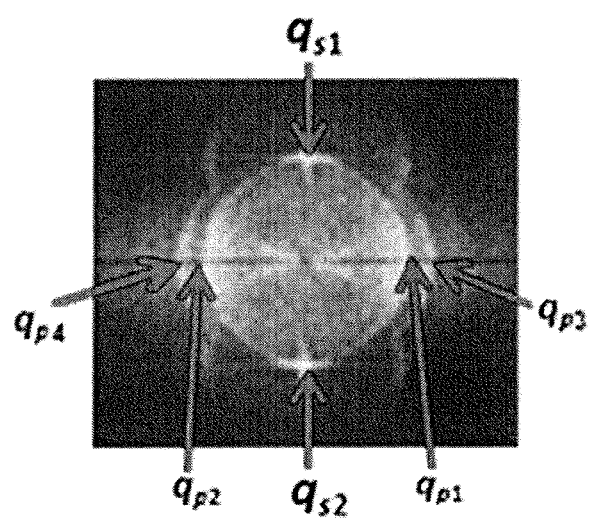
Figure 2C:
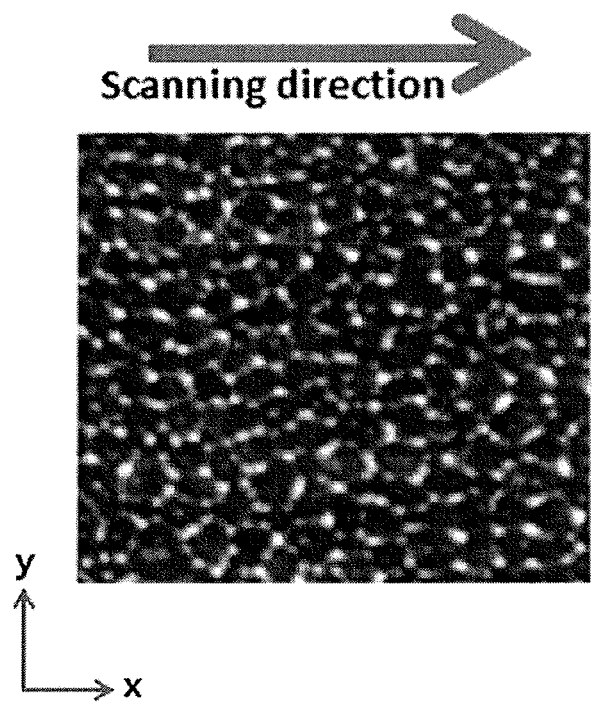
Figure 2D:
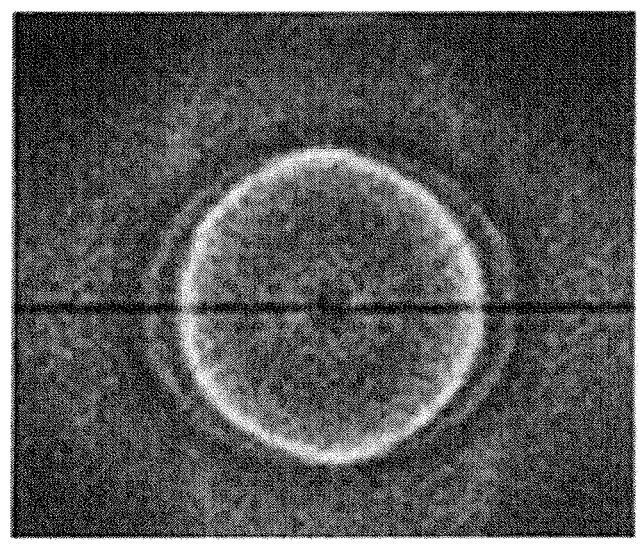

FIGS. 2A to 2D illustrate experimental results for surface roughness in a real space and an arrangement of reflexes in a Fourier space for a scanning direction, according to an exemplary embodiment of the present disclosure. FIGS. 2A and 2B illustrate a design 1 ELA, FIGS. 2C and 2D illustrate a design 2 ELA, FIGS. 2A and 2C illustrate a surface roughness result in a real space, and FIGS. 2B and 2D illustrate a reflex arrangement in a Fourier space.

Together with the irradiated surface observations in a real space, a Fourier transformation (FT) pattern of a surface profile change due to LIPSS generates a roughness spectrum that is characteristic of a laser induced harmonic wave. This is due to the refraction of a low-intensity probe beam from the modified irradiated surface and high-speed Fourier transformation processing of surface morphology photographs generated by atomic force microscopy (AFM).

LIPSS increases exponentially with respect to time from an initial time t=0 until an instability occurs, that is, when amplitudes of some roughness periods reach a saturated amplitude:

$$h_q(t) = h_{0q} \exp(\gamma_q t).$$ Equation (1)

Here, $h_q$ represents an amplitude of a grating having a wave vector q, $h_{0q}$ represents an initial value of the amplitude at the initial growth start time t=0, and $\gamma_q$, $\gamma_q > 0$, represents a time scale of the amplitude growth with respect to the grating having the wave vector q.

Analysis of Formation of Rectangular Grains

An FT pattern for plane-polarized laser radiation has a wide spectrum of surface roughness harmonics having different sizes and different directions. Experiment and theory, as illustrated in FIG. 2, show that some dominant roughness gratings more rapidly develop than other gratings, that is, have a maximum of $\gamma_q$ in wide angular spectrums of the LIPSS gratings. For example, for an incidence angle $\theta < 50°$ and a laser beam polarized perpendicular to an incidence plane, that is, so called "s-polarization", experiment and theory show that the dominant, that is, brightest, discrete and concentrated reflexes of LIPSS in the FT pattern are defined by the following surface roughness wave vectors:

$$q_{s1} = k_0 \cos \theta \text{ and } q_{s2} = -k_0 \cos \theta.$$ Equation (2)

Here, $k_0$ represents a wave vector of incident laser radiation, $k_0 = 2\pi/\lambda$, and $\lambda$ is a wavelength thereof.

The reflexes are hereinafter abbreviated as s-reflexes. In FIG. 2B, the reflexes substantially correspond to point reflexes which are very bright and concentrated in the FT pattern and are positioned above and below a center (zero) point of the FT pattern. In real space, shown in FIG. 2A, the reflexes correspond to one surface profile grating that is highly regular and parallel to grooves of the incidence plane (xz). The reflexes are shown horizontally in real space in FIG. 2A. A grating period is $d_s = 2\pi/|q_{s1}|$ and $d_s = \lambda/\cos \theta$), using Equation (2).

In addition, with regard to a laser beam polarized on the incident plane, known as "p-polarized", LIPSS reflexes, also referred to as p-reflexes, which dominate the FT pattern with respect to an incident angle $\theta < 50°$ are given as $q_{p1} = k_0(1 - \sin \theta)$ and $q_{p2} = -k_0(1 - \sin \theta)$. According to $d = 2\pi/|q|$, the reflexes correspond to gratings having a period $d_{p1} = \lambda/(1 - \sin \theta)$. Other dominant wave vectors for the p-polarization are $q_{p3} = k_0(1 + \sin \theta)$ and $q_{p4} = -k_0(1 + \sin \theta)$. The reflexes define a surface profile $d_{p2} = \lambda/(1 + \sin \theta)$. As illustrated in FIG. 2B, the reflexes $q_{p1}$ and $q_{p2}$ are brighter than the reflexes $q_{p3}$ and $q_{p4}$.

Figure 3A:
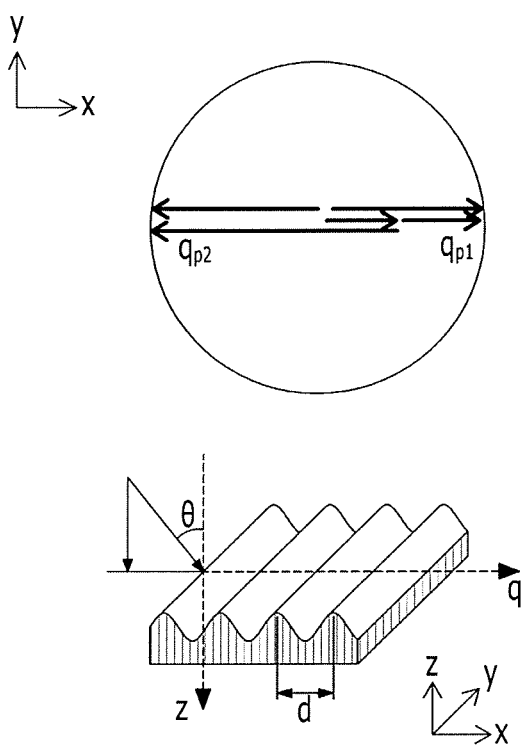
FIGS. 3A and 3B illustrate directions and arrangements of dominant p-reflexes and s-reflexes of LIPSS for an incidence plane and a scanning direction, according to an exemplary embodiment of the present disclosure.
Figure 3B:
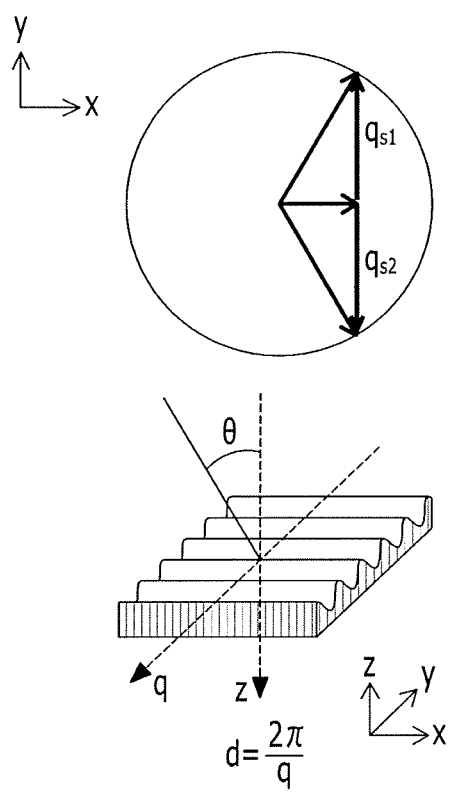

FIGS. 3A and 3B illustrate directions and arrangements of dominant p-reflexes and s-reflexes of LIPSS for an incidence plane and a scanning direction, according to an exemplary embodiment of the present disclosure. FIG. 3A corresponds to the p-reflexes and FIG. 3B corresponds to the s-reflexes.

FIGS. 3A-B show directions of the dominant s-reflexes and p-reflexes in the FT pattern with respect to the incidence plane (xz) and the scanning direction (x). Grooves of p-gratings having periods $d_{p1}$ and $d_{p2}$ are shown as vertical lines normal to the incidence plane in FIG. 2A. In this case, the p-reflexes are less concentrated than the s-reflexes described above and are diffused at an angle of approximately $\pm\phi_{0p}$. $\phi_{0p}$ is given below based on an average direction parallel to the incidence plane and the reflexes are shown horizontally in FIG. 2B.

$$\phi_{0p} \approx 20°$$ Equation (3)

Therefore, the parameter $\phi_{0p}$ may be referred to as a natural angular half-width of the p-reflex, where "natural" means that the beam angular divergence effects considered below are neglected. A similar natural angular half-width $\phi_{0s}$ may further be introduced with respect to the s-reflexes. Since the s-reflexes are more concentrated than the p-reflexes, the following definite relationship is established.

$$\phi_{0s} \ll \phi_{0p}$$ Equation (4)

In an embodiment of the present disclosure, UV laser radiation used in ELA includes unpolarized s and p components which randomly change. Therefore, after ELA, the FT pattern of the surface may include both the s and p reflexes. With respect to the design 1 ELA, shown in FIGS. 2A and 2B, the FT pattern of FIG. 2B actually shows the dominant (brightest) discrete and concentrated s-reflexes and and FIG. 2A shows well defined horizontal grooves parallel to the incidence plane of one grating in real space. In addition, the development of dominant blurred p-reflexes $q_{p1}$ and $q_{p2}$ normal to the incidence plane provides one grating having vertical relevant grooves which are not clear, as shown in FIG. 2A.

With regard to the overlapping of two dominant surface profile gratings having perpendicular grooves with respect to the s and p reflexes, FIG. 2A illustrates formation of a structure of rectangular grains in real space. The formation of rectangular cells on crystalline germanium when LIPSS is generated by a 1.06 μm standing laser beam having circular and elliptical polarization has been given previously.

Figure 4:
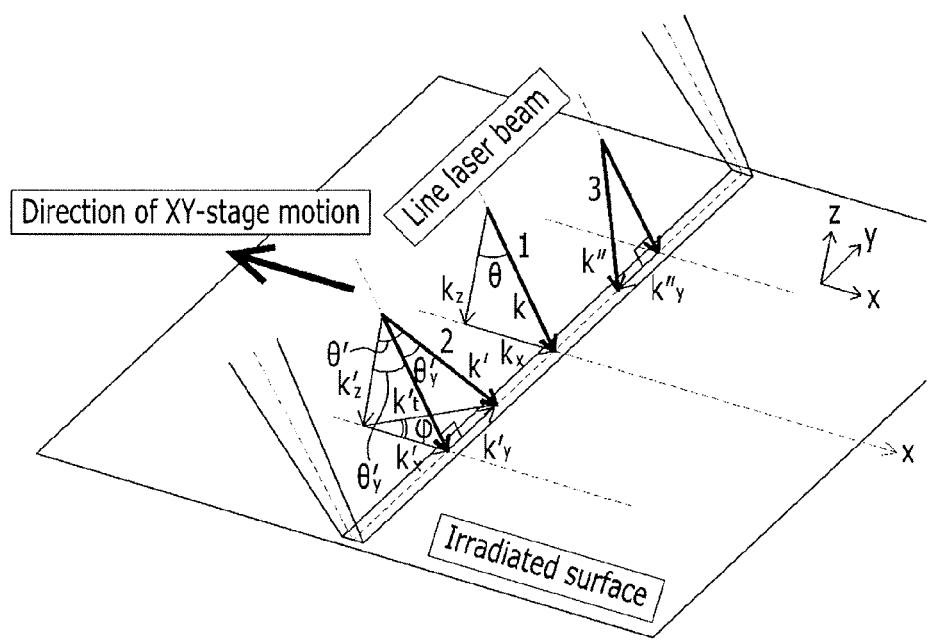
FIG. 4 schematically illustrates beams of different directions which constitute a main line beam in ELA, according to an exemplary embodiment of the present disclosure.

FIG. 4 illustrates beams of different directions which constitute a main line beam in ELA, according to an exemplary embodiment of the present disclosure.

Referring to FIG. 4, ELA beams are irradiated to the surface in which some laser beams cross each other and are mixed to form the long line beam, and a central beamlet 1 and a plurality of side beamlets 2 and 3 in multiple directions form angles with each other and with respect to the central beamlet 1.

The central beamlet 1 is irradiated to the surface at an incident angle θ and has a wavevector k with $k_x$, $k_z$, and $k_y$ (=0) components along x, y, and z axes, respectively. The side beamlet 2 is irradiated to the surface at an incident angle θ' and has a wavevector k' with $k'_x$, $k'_y$, and $k'_z$ components along the x, y, and z axes, respectively. The side beamlet 3 with a wavevector k" is symmetrical to the side beamlet 2 and a component $k''_y$ of the wavevector k" along the y axis is equal to $-k'_y$.

As illustrated in FIG. 4, the $k'_y$ component for the side beamlet 2 along a long axis (y) of the line beam causes a change of incidence angle from θ to θ' and the incidence angle for the side beamlet 2 forms a rotation angle φ in the incidence plane (xz) with respect to the central beamlet 1. Similar considerations apply to side beamlet 3. The rotational angle φ is defined below by the $k'_y$ component and the $k'_x$ component.

$$\tan \phi = k'_y / k'_x$$ Equation (5)

The following substitution may be defined by FIG. 5.

$$k'_y = k' \sin \theta'_y, k'_x = k' \cos \theta'_y \sin \theta'_x \text{ and } \theta'_x = \theta$$ Equation (6)

Accordingly, $$\phi = \arctan(\tan \theta'_y / \sin \theta)$$ Equation (7)

Figure 5A:
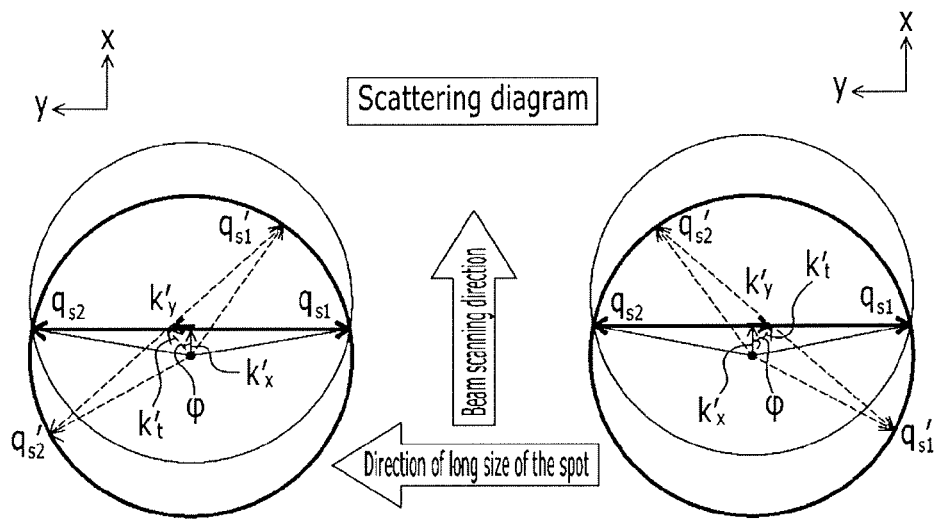
FIGS. 5A and 5B illustrate positional changes of dominant s-reflexes, according to an exemplary embodiment of the present disclosure.
Figure 5B:
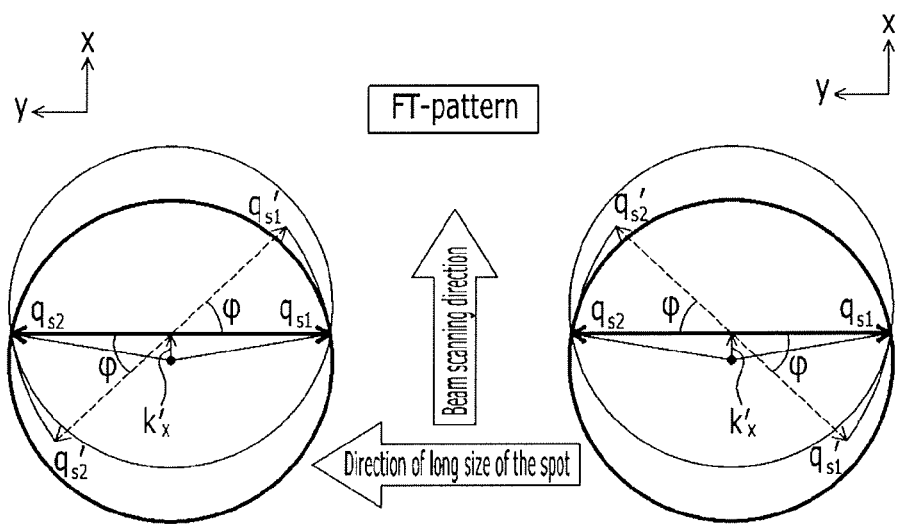
Figure 6A:
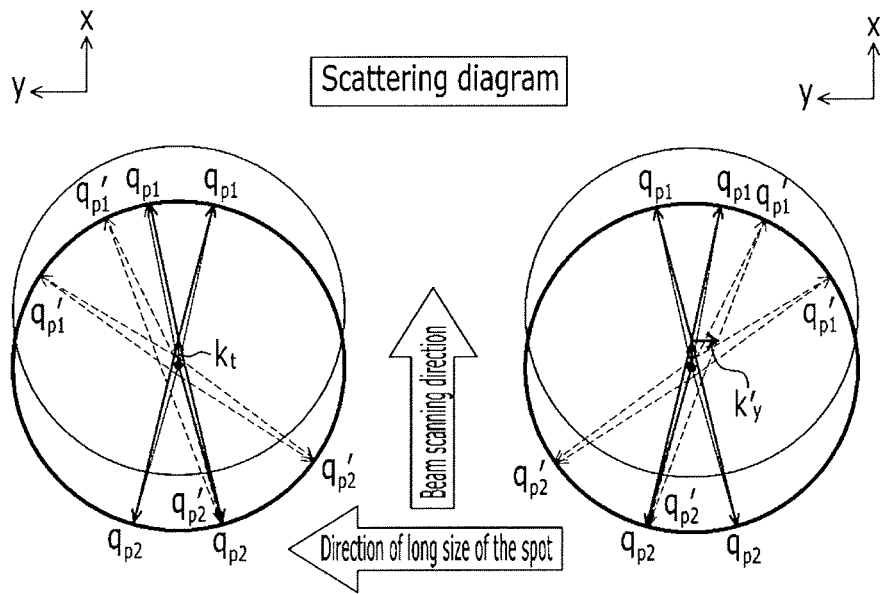
FIGS. 6A and 6B illustrate positional changes of dominant p-reflexes, according to an exemplary embodiment of the present disclosure.
Figure 6B:
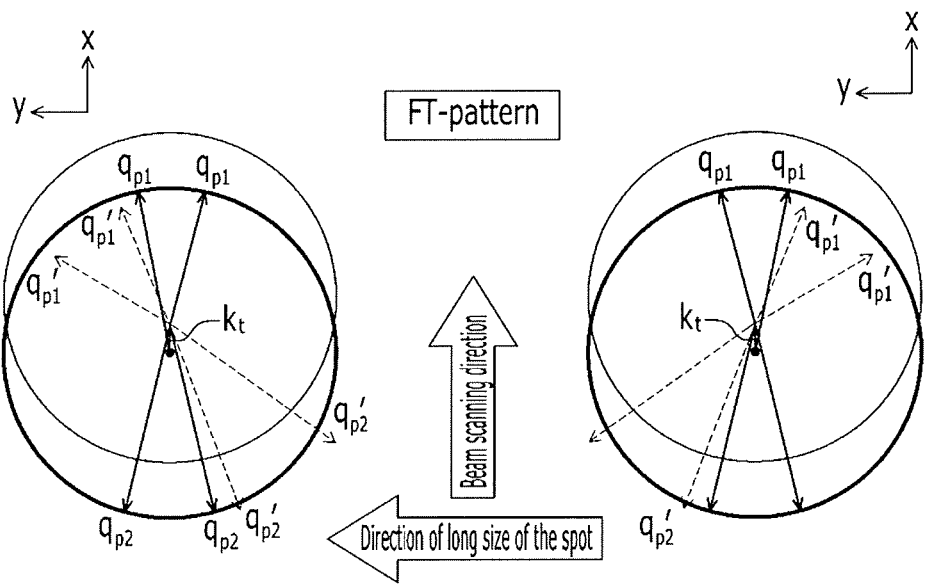

FIGS. 5A and 5B illustrate positional changes of the dominant s-reflexes and FIGS. 6A and 6B illustrate positional changes of the dominant p-reflexes, according to exemplary embodiments of the present disclosure. FIGS. 5A and 6A are scattering diagrams and FIGS. 5B and 6B illustrate an FT pattern.

Analysis of the FT pattern illustrated in FIGS. 5A-B and 6A-B shows that an increase of $\phi$ provides an increase in the angular half-widths of the s and p reflexes in the FT pattern.

For example, FIG. 5 schematically illustrates positional changes of dominant s-reflexes $q'_{s1}$ and $q'_{s2}$ with respect to the side beamlets having a y component of wave vector $k'_y$. Here, $q_{s1}$ and $q_{s2}$ are the initial positions of the s-reflexes, neglecting the beam angular divergence. FIG. 5A illustrates scattering of the dominant $q'_{s1}$ and $q'_{s2}$ reflexes along a diffraction contour. The new reflexes $q'_{s1}$ and $q'_{s2}$ are perpendicular to a new $k'_t$ vector, and the new reflexes consider the appearance effects of the $k'_y$ component of the side beamlets wavelengths.

FIG. 5B illustrates rotation by an angle $\pm\phi$ in the incidence plane of the side beamlets of the s-reflexes $q'_{s1}$ and $q'_{s2}$ in the FT pattern. The presence of the $k'_y$ component increases the thicknesses and the lengths of the lines of the reflexes and distributes the reflexes at the angles $\pm\phi$ in the directions of the initial positions $q_{s1}$ and $q_{s2}$ with respect to the side beamlets.

Similar considerations apply to the positional changes of the dominant p-reflexes $q'_{p1}$ and $q'_{p2}$ caused by the side beamlets having the y component of the wave vector may shown in FIG. 6.

In FIGS. 6A-B, $q_{p1}$ and $q_{p2}$ are initial positions of the p-reflexes, and when the angular half-widths of the reflexes are considered, $q_{p1}$ and $q_{p2}$ are approximately $\phi=\pm 20°$ in the direction of $k_t$, neglecting the beam angular divergence. The presence of the $k'_y$ components of the side beams brings about the same result as the presence of the $k'_y$ components for the s reflexes—an increase in thicknesses and lengths of the lines of the reflexes and a deviation of an average direction of the p reflexes by an angle $\pm\phi$ in the initial average direction. In addition, similar to the schemes in FIGS. 5A-B and 6A-B, it can seen that an x component change in $k_t$ due to beam focusing along a short axis (x) causes the reflexes to diverge along a diffraction oval contour and primarily increases the thicknesses of the reflex lines.

In Equation (7), $\theta'_y$ is an angular half-width of a beam that follows a beam long axis (y) and is represented below as $\theta_y$. Next, based on Equation (7), a new parameter $\phi$ that characterizes the beam as a normalized beam angular half-width may be introduced.

$$\phi=\arctan(\tan\theta_y/\sin\theta) \qquad \text{Equation (8)}$$

In summary, the increase of the rotational angle $\phi$ of the beamlets in the incidence plane provides an increase of the respective half-widths $\phi_s$ and $\phi_p$ of the s and p reflexes as given below:

$$\phi_s=\phi_{0s}+\phi \text{ and } \phi_p=\phi_{0p}+\phi \qquad \text{Equation (9)}$$

Here, $\phi_{0s}$ and $\phi_{0p}$ are natural angular half-widths of the s and p reflexes, respectively, where "natural" means that the effects of the beam angular divergence are neglected. According to Equations (8) and (9), in an FT pattern, the angular half-widths of the s and p reflexes increase together with the beam angular divergence $\theta_y$.

Effect of Crystalline Anisotropy

It has been shown that in the formation of LIPSS on crystalline Ge, three directions are present along a surface having material transfer, which define three formation directions of the ripples. In an FT pattern, the directions are separated from each other by an angle of $\alpha\cong 60°$.

Here, the crystalline structures of silicon and germanium are the same, namely a diamond cubic lattice. Therefore, three formation directions of the ripples in the lattice can be predicted.

Figure 9A:
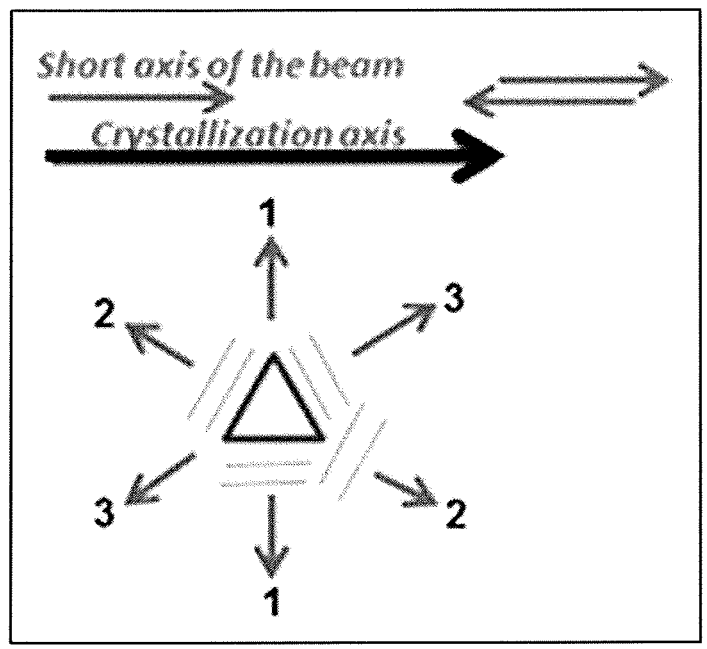
FIGS. 9A to 9C illustrate possible arrangements of three formation directions of ripple gratings, which have a symmetric characteristic for the crystallization axis, according to an exemplary embodiment of the present disclosure.

For an initial amorphous silicon film, similar directions are crystallized from pulse-to-pulse modification of the initial amorphous film, and the crystal growth gradually forms in similar directions. The directions correspond to directions of the crystal growth in the initial amorphous silicon film. An arrangement of directions is symmetric with respect to a crystallization axis, which is closest to a beam short axis direction and a maximum temperature gradient along a surface, as illustrated in FIGS. 7A and 9A, in an annealing according to an exemplary embodiment of the present disclosure.

Figure 7A:
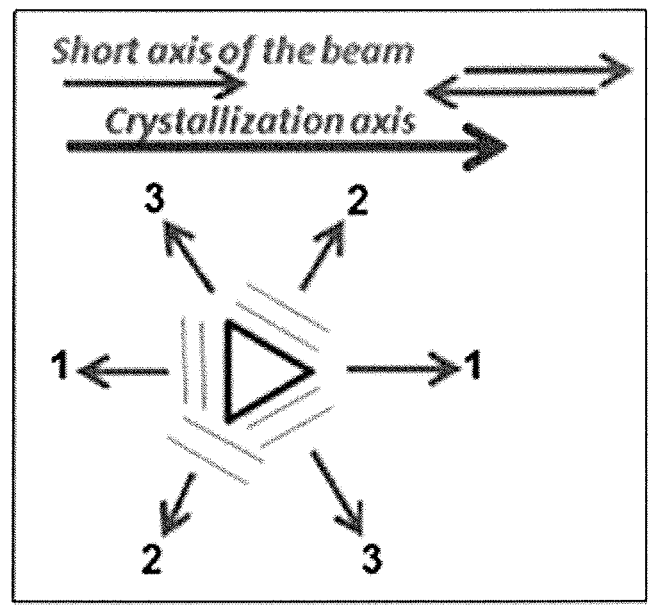
FIGS. 7A to 7C illustrate symmetrical arrangements of three crystallization axis directions, according to an exemplary embodiment of the present disclosure.
Figure 7B:
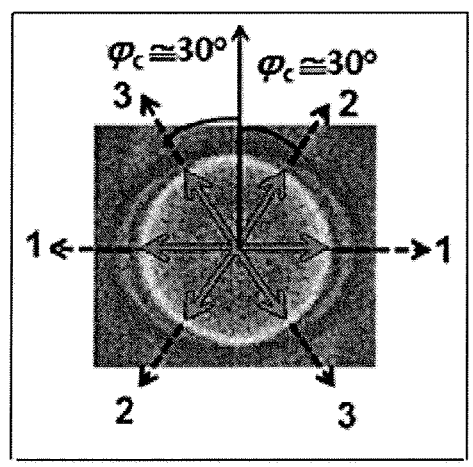
Figure 7C:
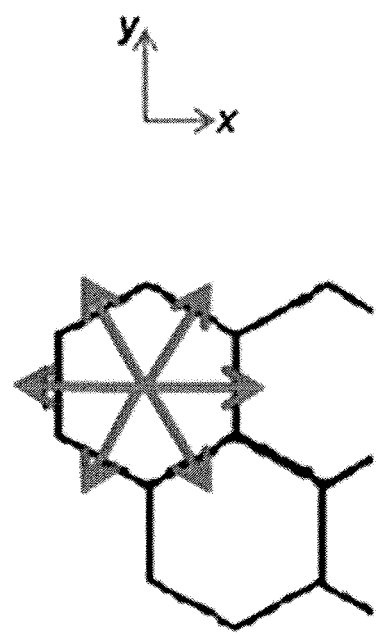

FIGS. 7A to 7C illustrate symmetrical arrangements of three crystallization axis directions, according to an exemplary embodiment of the present disclosure.

One possible symmetric array is illustrated in FIG. 7A. Three directions described herein follow lines 1, 2, and 3 and an angle between the directions is $\alpha\cong 60°$. As illustrated in FIG. 7B, one laser induced surface profile grating having a wave vector in the direction of the p-reflexes in FT space is accurately formed along line 1-1. When the angular half width $\phi_s$ of the s-reflex, measured from a vertical line in FIG. 7B, becomes larger than a critical value, two different LIPSSs develop having wave vectors in directions along lines 2-2 and 3-3 for unpolarized beams:

$$\phi_s\cong\phi>\phi_c. \qquad \text{Equation (10)}$$

From FIG. 7B, the critical value is $$\phi_c=\alpha/2\cong 30° \qquad \text{Equation (11)}$$

According to Equation (4), a smaller parameter $\phi_{0s}$ may be neglected for $\phi_s$ in Equation (10)

Therefore, when the following equation is satisfied, LIPSS gratings may be simultaneously formed in three anisotropic directions represented by arrows 1, 2, and 3 as illustrated in FIG. 7B:

$$\phi\cong\phi_c. \qquad \text{Equation (12)}$$

Since superposition of three gratings on the irradiated surface corresponds to formation of hexagonal grains in real space, a surface damage pattern changes. In real space, hexagon orientations are illustrated in FIG. 7C.

In addition, rectangular grains are formed when a condition opposite to that of Equation (12) is satisfied:

$$\phi<\phi_c. \qquad \text{Equation (13)}$$

This is a condition for the development of rectangles. From Equation (8), the condition may be expressed as below:

$$\theta_{y,c}=\arctan[\tan\phi_c\cdot\sin\theta]. \qquad \text{Equation (14)}$$

Equation (12) is the condition for the formation of hexagons and is satisfied by a laser beam having an angular divergence half-width which exceeds a critical value $\theta_{y,c}$:

$$\theta_y\geq\theta_{y,c}. \qquad \text{Equation (15)}$$

For example, when the incidence angle $\theta=6°$ and $\phi_c\cong 30°$, the critical value is:

$$\theta_{y,c}\cong 3.45°(=60.3 \text{ mrad}). \qquad \text{Equation (16)}$$

Therefore, a condition for the formation of the rectangles is:

$$\theta_y < \theta_{y,c}. \quad \text{Equation (17)}$$

Figure 8:
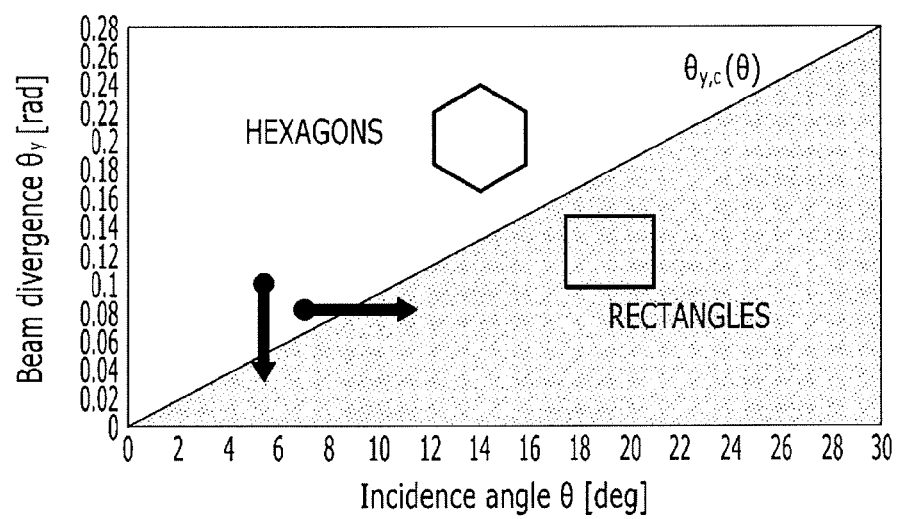
FIG. 8 illustrates areas of hexagonal grains and rectangular grains in a plane of parameters θ and $\theta_y$, according to an exemplary embodiment of the present disclosure.

FIG. 8 illustrates areas of hexagonal grains and rectangular grains in a plane of parameters θ and $\theta_y$ according to exemplary embodiments of the present disclosure.

A curve $\theta_{y,c}$ is illustrated in FIG. 8. The curve separates the θ–$\theta_y$ plane into two areas, that is, an area of hexagons above the curve and an area of rectangles, for which $\theta_y < \theta_{y,c}$, below the curve. A transition to the rectangle area from the hexagon area, as represented by arrows, may be triggered by decreasing the angular divergence $\theta_y$ along a vertical arrow or increasing the incident angle θ along a horizontal arrow.

Figure 9B:
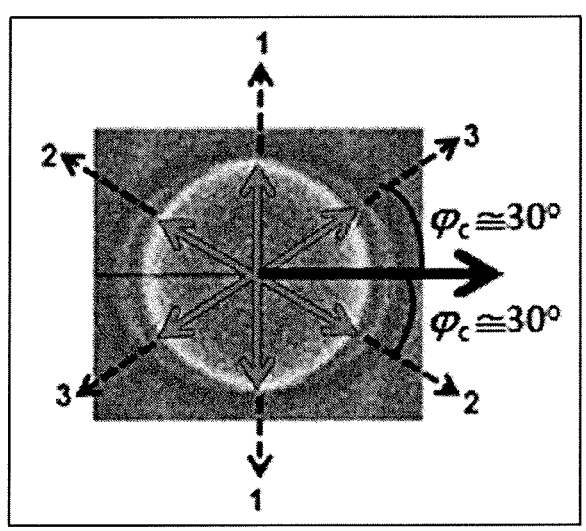
Figure 9C:
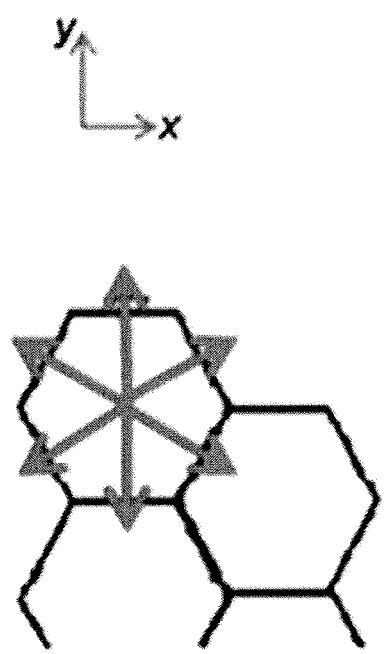

FIGS. 9A to 9C illustrate possible arrangements of three formation directions of ripple gratings.

An array of the aforementioned three formation directions of the ripple lattices that differs from those of FIGS. 7A-C is illustrated in FIGS. 9A-C. However, experimental photographs, such as those shown in FIG. 2C, of laser-annealed silicon illustrate that the hexagons have a vertex that is pointed along a y axis direction, that is, in the direction of the s-reflexes wave vectors. The comparison of the experimental observations and the aforementioned possible formation arrangements shows that the experimental observations of the hexagons correspond to the case illustrated in FIG. 7C, but do not correspond to expected hexagon directions illustrated in FIG. 9C.

In an exemplary embodiment of the present disclosure, formation of rectangular grains can be obtained over an entire surface of the film while simultaneously avoiding formation of undesirable hexagonal grains to improve the quality of a large-area scanning excimer laser annealing (ELA) process that uses a focused line laser beam. The focused line laser beam may have, for example, a width of 10 to 500 μm and a length of 200 to 2,000 mm.

In transformation from an initial amorphous state to an annealed polycrystalline state, the shapes of the arising grains and the quality of the laser annealed surface can be controlled by the angular width of the irradiated laser beam. When a beam angular half-width $\theta_y$ in a y direction perpendicular to an incident plane of radiation is less than a certain critical value, i.e. $\theta_y < \theta_{y,c}$, where $\theta_{y,c}$ depends on a mean angle θ of the radiation incident angle: $\theta_{y,c} = \theta_{y,c}(\theta)$, rectangular shaped grains of polycrystalline silicon (p-Si) are generated on the laser annealed surface of the initially amorphous film. On the other hand, for a laser beam having a larger $\theta_y$, if the opposite inequality ($\theta_y > \theta_{y,c}$ is fulfilled, the shapes of the formed crystalline grains change to hexagons. In ELA, to obtain rectangular grains, the use of a laser beam angular divergence and/or larger incident angles can avoid the formation of the hexagonal grains.

In an exemplary embodiment of the present disclosure, in a method of irradiating a laser beam, an unpolarized laser beam is irradiated to the surface, and the beam angular divergence half-width $\theta_y$ measured on the irradiated surface in the y direction y and normal to the incident surface of the radiation along the spot long-axis is limited by the critical value:

$$\theta_y < \theta_{y,c}. \quad \text{Equation (1*)}$$

Here, the critical value $\theta_{y,c}$ depends on the mean incident angle θ of the laser radiation as follows, and the angle parameter $\phi_c = 30°$ is defined by crystal anisotropy properties.

$$\theta_{y,c} = \arctan[\tan \phi_c \cdot \sin \theta] \quad \text{Equation (2*)}$$

In another exemplary embodiment of the present disclosure, in an aforementioned method of irradiating an unpolarized laser beam, the laser beam is irradiated to the surface, and the beam has an incident angle θ of 6° and the beam angular divergence half-width $\theta_y$ measured on the irradiated surface in the y direction and normal to the incident surface of the radiation along the spot long-axis is limited by the critical value: $\theta_y < \theta_{y,c}$, where $\theta_{y,c} = 60.3$ mrad (=3.46°).

In yet another exemplary embodiment of the present disclosure, in a method of irradiating a laser, the unpolarized laser beam is irradiated to the surface. Here, the laser beam has a beam angular divergence $\theta_y$ which is already large enough to not satisfy the aforementioned condition of $\theta_y < \theta_{y,c}(\theta_1)$ for forming the rectangular grains for one incident angle $\theta = \theta_1$. However, the aforementioned condition $\theta_y < \theta_{y,c}$ for forming the rectangular grains can be satisfied by increasing the incident angle from the previous value $\theta_1$ to a new incident angle $\theta_2$.

For example, with respect to a new value $\theta_2 = 12°$, $\theta_{y,c} = 119.4$ mrad instead of 60.3 mrad for the previous value of $\theta_1 = 6°$, is obtained from Equation (2*). This means that even though the formation of rectangular grains is impossible with respect to the previous incidence angle $\theta_1 = 6°$, with a new higher incident angle $\theta_2 = 12°$, the formation of rectangular grains is possible even for ELA beams having $\theta_y = 62$-70 mrad.

In still yet another exemplary embodiment of the present disclosure, in a laser irradiating method, an unpolarized laser beam is irradiated to the surface. Here, during laser processing, initially, the laser beam has a beam angular divergence $\theta_y$ which is low enough to satisfy conditional Equation (1*) for forming rectangular shapes, and low enough to maintain laser beam processing parameters such as gas discharge stability, beam divergence stability, and optics cleanliness, and thus, maintain beam scattering at a sufficiently low level for forming the rectangular grains. On the contrary, high radiation scattering may increase beam divergence such that the aforementioned Equation (1*) for forming the rectangles is not satisfied and undesirable hexagonal grains are formed.

In still yet another exemplary embodiment of the present disclosure, in a laser irradiating method, instead of an unpolarized light in the aforementioned points, circularly-polarized, elliptically-polarized, or plane-polarized light having s- and p-polarization components of for a given ELA setup geometry may be used.

In still yet another exemplary embodiment of the present disclosure, in a laser irradiating method, the laser radiation beam is s-polarized onto the surface to be processed, that is, in the beam, a direction of an electric field is vertical to a relative scanning direction of the beam and the surface, and two vertical scannings of the laser beam relative to the surface are performed to generate two vertical LIPSSs, respectively. A laser normalized beam angular divergence half-width ϕ on the processed surface should be less than 30° and may be less than 5°.

Figure 10:
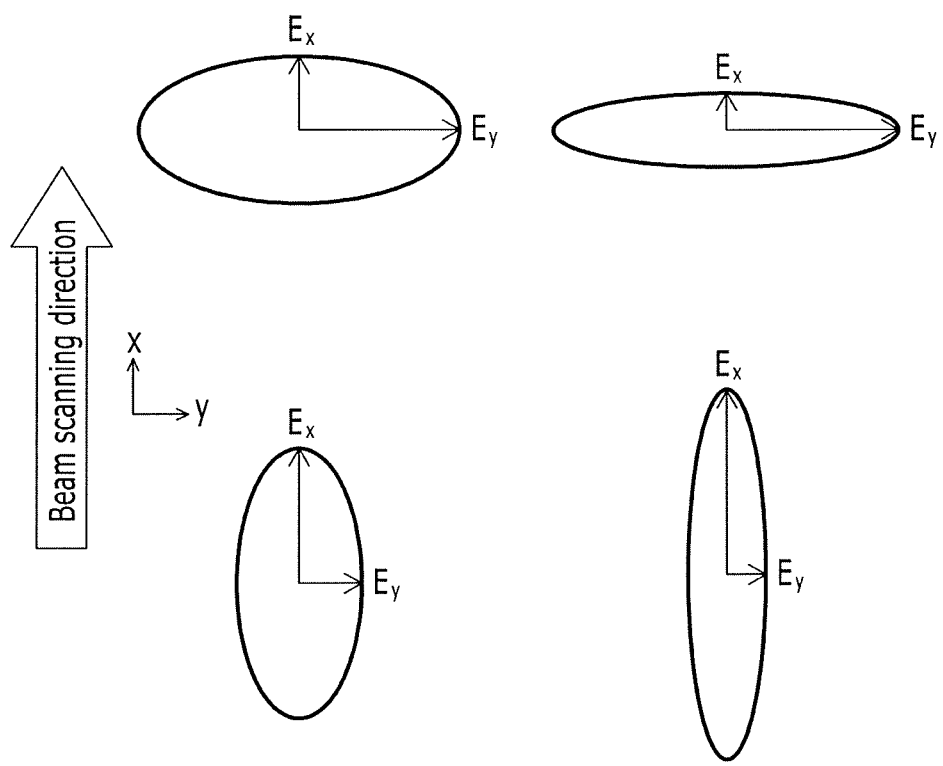
FIG. 10 schematically illustrates an elliptically polarized laser beam for use in ELA, according to an exemplary embodiment of the present disclosure.

FIG. 10 schematically illustrates an elliptically-polarized laser beam for a use in ELA, according to an exemplary embodiment of the present disclosure.

In aforementioned exemplary embodiments, even though an effect of the beam divergence is considered with respect to unpolarized light, the results may also be applied to circularly-polarized, elliptically-polarized, and planarly-polarized light having both the s- and p-polarization components in the ELA setup geometry. In FIG. 10 illustrates four possible arrangements of elliptically-polarized light with elliptical polarization axes $E_x$ and $E_y$.

Results obtained for a 308 nm wavelength UV excimer XeCl laser may be suggestive for other UV lasers used. For example, the results may be suggestive for a 192 to 352 nm wavelength UV excimer gas laser and a 265 to 356 nm wavelength UV solid-state laser.

Increasing the beam angular divergence may also effect similar changes in grain shapes with respect to the annealing of other materials, particularly germanium, which has crystalline characteristics similar to silicon.

Example 1

Figure 11A:
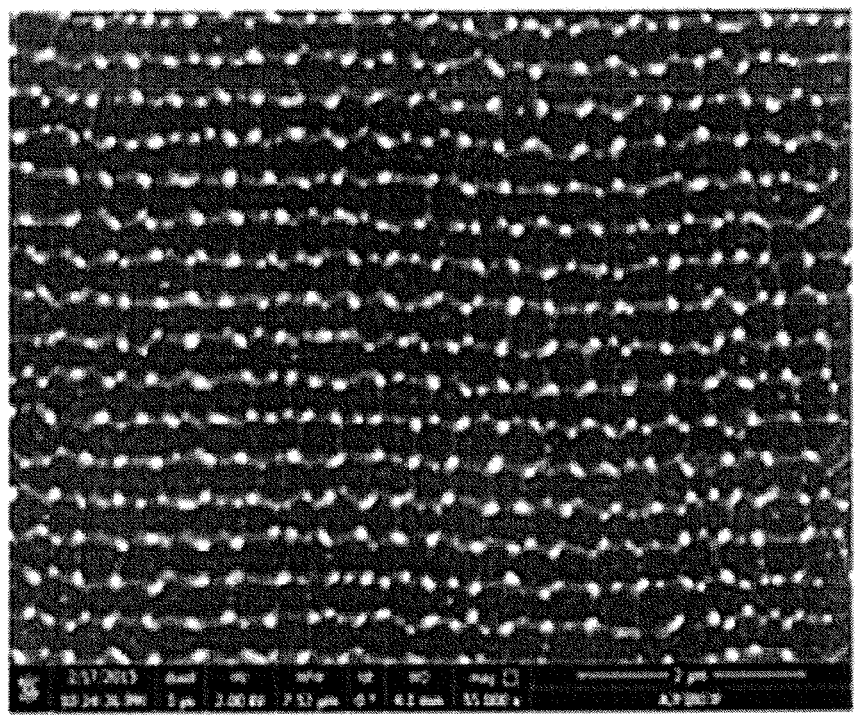
FIGS. 11A to 11C illustrate experimental data demonstrating shape changes of grains from rectangles to hexagons when using laser beams having different angular divergences, according to an exemplary embodiment of the present disclosure.
Figure 11B:
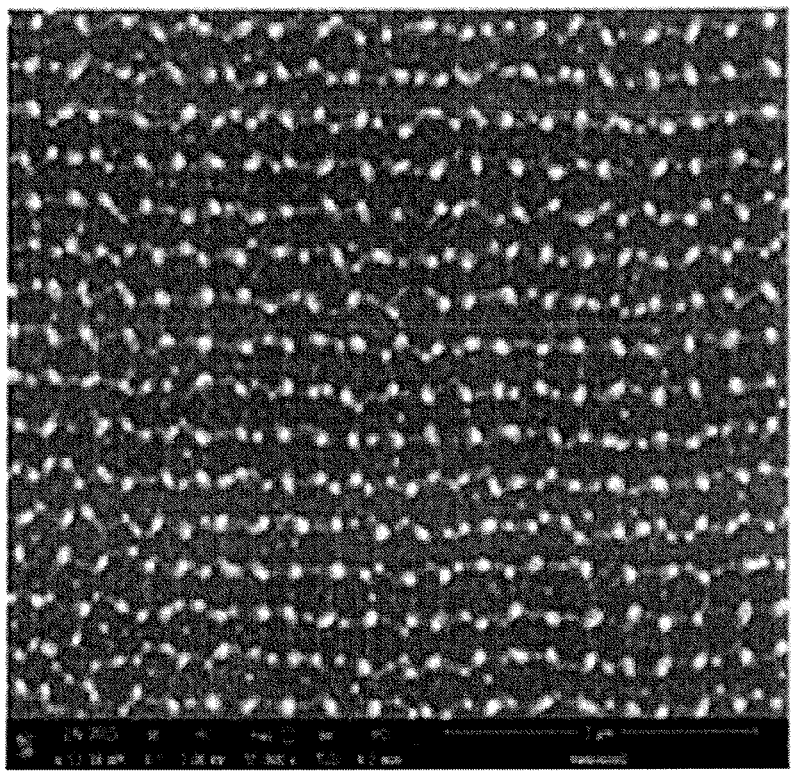
Figure 11C:
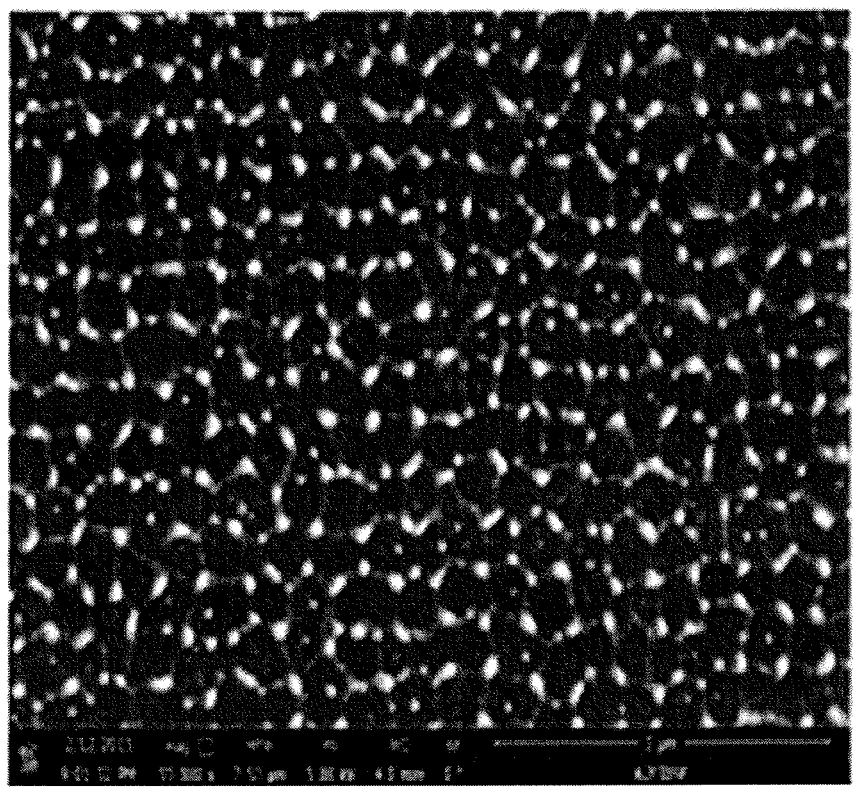

FIGS. 11A to 11C illustrate experimental data that demonstrate grain shape changing from rectangles to hexagons when using laser beams having different angular divergences. FIG. 11A corresponds to 40 mrad, FIG. 11B corresponds to 50 mrad, and FIG. 11C corresponds to 62 mrad.

Experimental data illustrate that grain shapes change from rectangles, shown in FIGS. 11A and 11B, to hexagons, which start to be shown in FIG. 11B when the beam angle half-width is 50 mrad and then are most evidently shown in FIG. 11C when the beam angle half-width is 62 mrad. Here, AFM photographs of the annealed Si surface were obtained from experiments using a design 2 ELA and from 2 to 6 beamlets that include a main long line laser beam in the setup. The angular width $\theta_y$ of the resultant line beam was allowed to change.

An incident angle of 6° was used in the given experiment. Equation 16, which expresses the theoretical criteria for a critical beam angular divergence for forming hexagonal grains, yields $\theta_{y,c} \cong 60.3$ mrad ($=3.45°$), coincides with the observed experimental critical value and the angular half-width is within the range of 50 to 62 mrad.

Example 2

Figure 12A:
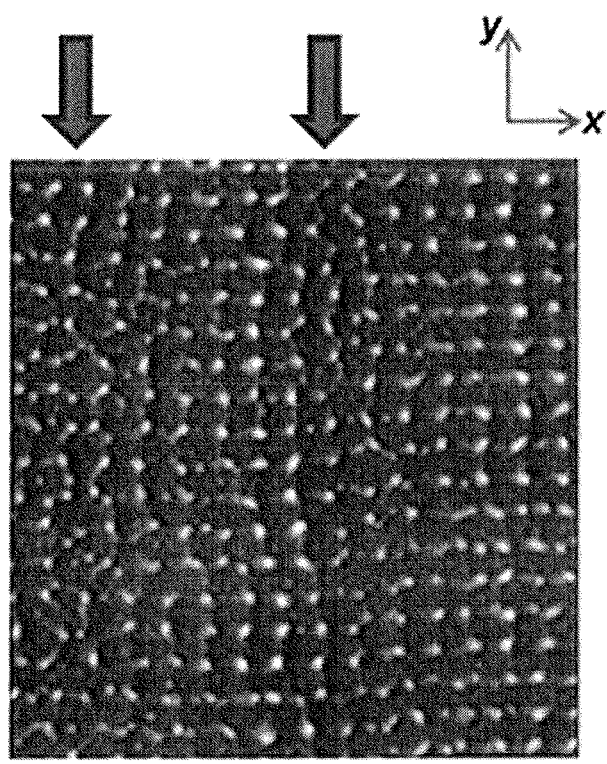
FIG. 12A is a photograph showing spontaneous switching of grain shapes from rectangular to hexagonal in some strips on an annealed surface.
Figure 12B:
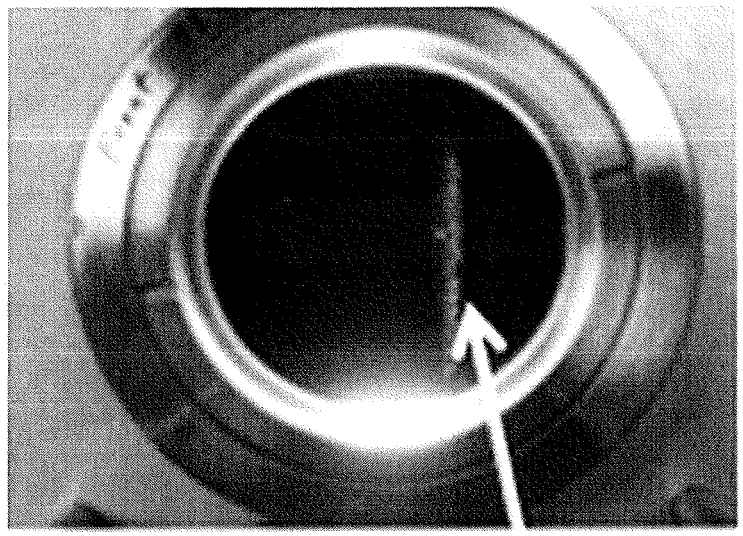
FIG. 12B is a photograph showing contamination of an exit window of a laser cavity, according to an exemplary embodiment of the present disclosure.

FIG. 12A is a photograph showing spontaneous switching of grain shapes from rectangular to hexagonal in some strips on an annealed surface, and FIG. 12B is a photograph showing contamination of an exit window of a laser cavity.

FIG. 12 illustrates results of the different experiments using a design 1 ELA. FIG. 12A illustrates switching of grain shapes from rectangular to hexagonal in some strips on an annealed surface, shown in a left part and a central part of the photograph As indicated by the downward arrows. The contamination of the exit window observed in this experiment and illustrated in FIG. 12B may illustrate a change in grain shapes.

Here, optical laser radiation scattering due to optical inhomogeneities of the laser gas activation medium or any optical elements of the ELA setup, in particular, due to the contamination that accumulated on the exit window of the laser cavity during the laser operation, may induce an additional increase of the beam divergence beyond the aforementioned critical value of 50 to 62 mrad on the irradiated surface and change the grain shapes from rectangular to hexagonal. Accordingly, to obtain rectangular grains and suppress formation of hexagonal grains, the generation and increase of the laser radiation scattering due to optical inhomogeneities of the laser gas activation medium or due to the contamination of the optical elements of the ELA setup, which may occur while the laser operates, should be avoided.

Example 3

With respect to one incident angle $\theta=\theta_1$, an unpolarized laser beam may already have a sufficiently high angular divergence $\theta_y$ so that the condition of $\theta_y < \theta_{y,c}(\theta_1)$ for forming the rectangular grains is not satisfied. However, since Equation 14 indicates that the critical beam angular half-width $\theta_{y,c}$ increases together with the incident angle $\theta$, the limit of $\theta_{y,c}(\theta)$ may be extended by increasing the previous value $\theta_1$ of the incident angle $\theta$ to a new incident angle $\theta_2$, until the condition $\theta_y < \theta_{y,c}$ for forming the rectangular grains is satisfied.

For example, with respect to a new value $\theta_2=12°$, $\theta_{y,c}=119.4$ mrad is obtained, instead of 60.3 mrad for the previous incident angle value $\theta_1=6°$. This means that using a larger incident angle in the ELA enables formation of rectangular grains, which was impossible for the previous incident angle $\theta_1=6°$, even with respect to relatively high divergence beams having typical $\theta_y=62$-90 mrad in a design 2 ELA. Thus, the condition of Equation 17 with respect to $\theta_2$ is satisfied for the formation of rectangles: 62-90 mrad$=\theta_y < \theta_{y,c}(\theta_2)=119.4$ mrad. This situation is shown by a horizontal arrow in FIG. 8.

Example 4

Figure 13:
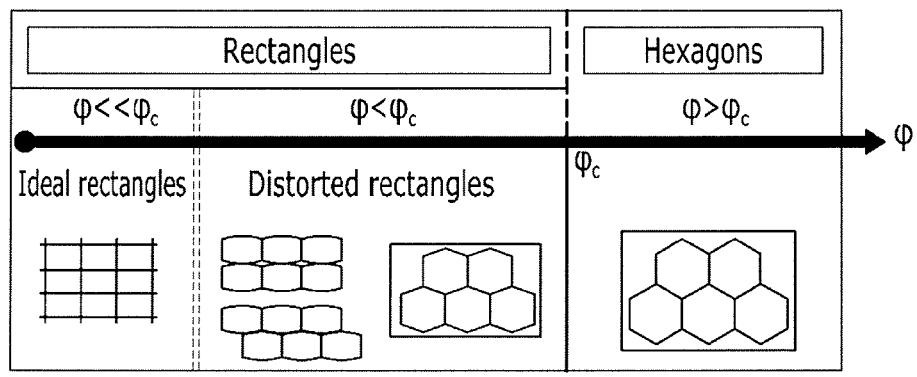
FIG. 13 schematically illustrates shape changes of grains as a function of increasing normalized beam angular divergence half-width φ, according to an exemplary embodiment of the present disclosure.

FIG. 13 schematically illustrates shape changes of grains as a function of increasing normalized beam angular divergence $\phi$, according to an exemplary embodiment of the present disclosure.

When describing photographs of FIGS. 11A and 11B in detail, even when Equation 13 of $\phi < \phi_c$ is satisfied, the grains do not have tight rectangular shapes, are distorted, and resemble barrels with curved horizontal sides.

Due to the shape distortion, the grains do not form dense packages, unlike ideal rectangles. A loss of dense packaging corresponds to thickening boundaries between the grains. As a result, the relative content of uncrystallized amorphous material in the layer has increased, and since the uncrystallized material is a main component of the grain boundaries, electron availability in the layer deteriorates.

Since this result is not useful or practical, an undesirable curvature effect may be described and controlled in a model according to an embodiment by a finite angular width $\phi_s$ of s-reflexes, since the reflexes form the curved horizontal sides of the rectangles, shown in FIGS. 12A and 12B. An ideal case of $\phi_s=0$ corresponds to an infinite narrow angular width of the s-reflexes and corresponds to obtaining ideal non-distorted rectangles having linear sides. In Equations 4, 9, and 10, $\phi_s \cong \phi$, which means that when $\phi$ is reduced to levels $\phi << 30°$, for example, $\phi \leq 5°$, along with a corresponding reduction in a boundary thickness between the grains and improvement in material electron mobility, a reduction of a barrel effect may be achieved in the particle shapes.

The large reduction of $\phi$ ($<<30°$) may be achieved by selection of a laser beam having a decreased angular divergence $\theta_y$ and/or an increased incident angle $\theta$, as expressed by Equation (8). For example, for a laser beam having a divergence angular half-width of $\theta_y=1.24°$ ($=21.7$ mrad) and an incident angle $\theta=15°$, it can be obtained from Equation (8) that $\phi=4.8°$, that is, the values of $\phi \leq 5°$ may be approached.

This example shows that a gradual change in grain shapes occurs together with an increase in $\phi$.

Example 5

As described above, under irradiation by an unpolarized beam, the s- and p-components of the electric field of the beam simultaneously induce the gains to form a rectangular structure, illustrated by the overlap of two perpendicular LIPSSs.

Another possibility of forming two overlapping perpendicular LIPSSs is to use two individual surface scannings in perpendicular directions using plane-polarized (s-polarized) light instead of one surface scanning using unpolarized light. As the result of the first laser scanning with s-polarized light, the first LIPSS is generated with linear grooves in the scanning direction. The second scanning is performed in a direction perpendicular to the direction of the first scanning and with s-polarized light that generates the second LIPSS, and the linear grooves thereofare perpendicular to the grooves of the first LIPSS. The overlapping on the surface of the two LIPSSs having the linear grooves generates a rectangular grain structure.

In the two scannings, an s-polarized beam should be used, and the reason is that a very regular LIPSS having very straight, periodic and continuous grooves is formed, as compared with that formed by p-polarization.

When a beam having sufficiently small normalized beam angular divergence $\phi$ is used, as described in Example 4, distortion of the LIPSS grooves may be further reduced. For example, the irradiated beams may have $\phi \approx 5°$.

A laser annealing method using s-polarization radiation and beam operation on a surface in two perpendicular directions can obtain grains with higher periodicity and more uniformity.

According to embodiments of the present disclosure, the normalized angular width $\phi$ of the irradiated laser beam controls the shapes of the grains and determines the quality of the generated laser-annealed Si surface, and this is defined by the beam angular divergence $\theta_y$ that follows the long axis of the beam and a mean incident angle $\theta$ of the long line beam. Embodiments of the present disclosure also provide a method of avoiding the formation of the hexagonal grains and improving a structure of the obtained rectangular grains by approximating the shapes to an ideal rectangle. Rectangular grains can be obtained by limiting the beam angular divergence for the laser sources providing a line ELA beam having an extended length of 1,500 nm or more which are used for continuity of mass production of the display device.

While embodiments of this disclosure has been described in connection with what is presently considered to be practical exemplary embodiments, it is to be understood that embodiments of the disclosure are not limited to the disclosed embodiments, but, on the contrary, are intended to cover various modifications and equivalent arrangements included within the spirit and scope of the appended claims.

What is claimed is:

1. A method of excimer laser annealing comprising:
generating a focused long line beam with a laser beam output from at least one laser source; and
scanning the long line beam in a direction perpendicular to a long axis of the long line beam along a surface of an amorphous semiconductor film on a substrate,
wherein the long line beam has a normalized beam angular divergence half-width $\phi=\arctan(\tan \theta_y/\sin \theta)$ that is less than a critical value $\phi_c$,
wherein $\theta_y$ represents a beam angular divergence half-width measured along the long axis of the long line beam on the surface of the amorphous semiconductor film, $\theta$ represents a mean incidence angle of the long line beam on the surface of the amorphous semiconductor film, and $\phi_c$ is approximately 30°.

2. The method of claim 1, wherein:
the long line beam is unpolarized on the surface of the amorphous semiconductor film.

3. The method of claim 2, wherein:
the beam angular divergence half-width $\theta_y$ is less than a critical value $\theta_{y,c}$,
wherein the critical value $\theta_{y,c}$ depends on the mean incidence angle $\theta$ and the critical value $\phi_c$ as expressed by $\theta_{y,c}(\theta)=\arctan [\tan \phi_c \cdot \sin \theta]$.

4. The method of claim 3, wherein:
the long line beam has the mean incidence angle $\theta=6°$ and the beam angular divergence half-width $\theta_y$ is less than 60.3 mrad.

5. The method of claim 3, further comprising:
increasing the mean incidence angle $\theta$ from a previous value $\theta_1$ to a new incidence angle $\theta_2$ wherein $\theta_y<\theta_{y,c}(\theta_2)$ is satisfied, when the beam angular divergence half-width $\theta_y$ of the long line beam does not satisfy $\theta_y<\theta_{y,c}(\theta_1)$ for the previous value of the mean incidence angle $\theta=\theta_1$.

6. The method of claim 5, wherein:
the long line beam has the beam angular divergence half-width $\theta_y$ in the range of 62 to 90 mrad and $\theta_2>12°$.

7. The method of claim 1, wherein:
the long line beam has a width in the range of 10 to 500 mm and a length in the range of 200 to 2000 mm.

8. The method of claim 1, wherein:
the normalized beam angular divergence half-width $\phi$ is less than 5°.

9. The method of claim 8, wherein:
the normalized beam angular divergence half-width $\phi$ is 4.8°, the beam angular divergence half-width $\theta_y$ is 1.24° (=21.7 mrad), and the incidence angle $\theta$ is 15°.

10. The method of claim 1, wherein:
the laser beam is elliptically polarized on the surface of the amorphous semiconductor film and a direction of a dominant polarization axis follows a direction of the scanning or is perpendicular to the scanning direction.

11. The method of claim 1, wherein:
the long line beam is circularly polarized on the surface of the amorphous semiconductor film.

12. The method of claim 1, wherein:
the long line beam is plane-polarized on the surface of the amorphous semiconductor film and has both s- and p-polarization components in an excimer laser annealing set-up geometry.

13. The method of claim 1, wherein:
the long line beam is s-polarized on the surface of the amorphous semiconductor film.

14. The method of claim 13, wherein:
two perpendicular scannings of the long line beam are performed relative to the surface of the amorphous semiconductor film to generate two perpendicular laser-induced periodic surface structures (LIPSSs).

15. The method of claim 1, wherein:
the laser source is a UV gas laser having a wavelength in the range of 192-352 nm.

16. The method of claim 1, wherein:
the laser source is a UV solid laser having a wavelength in the range of 265-356 nm.

17. The method of claim 1, wherein:
the amorphous semiconductor film is an amorphous silicon film.

18. A method of excimer laser annealing comprising:
scanning a focused long line laser beam in a direction perpendicular to a long axis of the long line beam along the surface of an amorphous semiconductor film on a substrate,
wherein the long line beam has a normalized beam angular divergence half-width $\phi=\arctan(\tan \theta_y/\sin \theta)$ that is less than a critical value $\phi_c$, wherein $\theta_y$ represents a beam angular divergence half-width measured along the long axis of the long line beam on the surface of the amorphous semiconductor film, $\theta$ represents a mean incidence angle of the long line beam on the surface of the amorphous semiconductor film, and $\phi_c$ is approximately 30°; and if the beam angular divergence half-width $\theta_y$, is greater than a critical value $\theta_{y,c}(\theta)=\arctan[\tan\phi_c \cdot \sin\theta]$, increasing the mean incidence angle $\theta$ to a new incidence angle $\theta_2$ wherein $\theta_y < \theta_{y,c}(\theta_2)$ is satisfied.

19. The method of claim 18, wherein:

the long line beam has the mean incidence angle $\theta=6°$ and the beam angular divergence half-width $\theta_y$ is less than 60.3 mrad.

20. The method of claim 18, wherein:

the long line beam has the beam angular divergence half-width $\theta_y$ in the range of 62 to 90 mrad and $\theta_2 > 12°$.

* * * * *